(12) United States Patent
Feng et al.

(10) Patent No.: US 11,632,056 B2
(45) Date of Patent: Apr. 18, 2023

(54) OFF-GRID PHASE SPLITTER AND INVERTER SYSTEM

(71) Applicant: HUAWEI TECHNOLOGIES CO., LTD., Guangdong (CN)

(72) Inventors: Ningbo Feng, Xi'an (CN); Jie Yi, Shenzhen (CN); Hang Wang, Xi'an (CN); Qingyu Wang, Xi'an (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/471,701

(22) Filed: Sep. 10, 2021

(65) Prior Publication Data
US 2021/0408938 A1 Dec. 30, 2021

Related U.S. Application Data

(63) Continuation of application No. PCT/CN2020/081152, filed on Mar. 25, 2020.

(30) Foreign Application Priority Data

Jun. 14, 2019 (CN) .......................... 201910516735.2

(51) Int. Cl.
*H02M 5/08* (2006.01)
*H02J 9/06* (2006.01)
(Continued)

(52) U.S. Cl.
CPC ............ *H02M 5/08* (2013.01); *H02J 9/062* (2013.01); *H03H 7/21* (2013.01); *H01P 5/12* (2013.01); *H02M 7/537* (2013.01)

(58) Field of Classification Search
CPC ............ H02M 5/02; H02M 5/04; H02M 5/06; H02M 5/08; H02M 5/275; H02M 5/293; H02M 7/42; H02M 7/44; H03H 7/21
See application file for complete search history.

(56) References Cited

U.S. PATENT DOCUMENTS

| 2004/0165408 A1 | 8/2004 | West et al. |
| 2019/0207527 A1* | 7/2019 | Norisada ................ H02M 7/797 |
| 2021/0344275 A1* | 11/2021 | Huang ..................... H02M 5/14 |

FOREIGN PATENT DOCUMENTS

| CN | 101552555 A | 10/2009 |
| CN | 102244477 A | 11/2011 |

(Continued)

OTHER PUBLICATIONS

Sang-Hyun Park et al.,"Single-Magnetic Cell-to-Cell Charge Equalization Converter With Reduced Number of Transformer Windings",IEEE Transactions on Power Electronics, vol. 27, No. 6. Jun. 2012,total 12 pages.

(Continued)

*Primary Examiner* — Gary L Laxton
(74) *Attorney, Agent, or Firm* — Womble Bond Dickinson (US) LLP

(57) ABSTRACT

In an embodiment, an off-grid phase splitter includes: a first input port and a second input port that are separately connected to a power supply; a first output port and a second output port that provide a second voltage, and the second output port and a third output port provide a third voltage; a first capacitor connected between the first output port and the second output port; a second capacitor connected between the second output port and the third output port; a first switch circuit and a second switch circuit connected in series to form a first node between the first input port and the second input port, where the first switch circuit and the second switch circuit are unidirectionally switched on in opposite directions,; and an inductor connected between the first node and the second output port.

18 Claims, 5 Drawing Sheets

(51) Int. Cl.
  *H03H 7/21*     (2006.01)
  *H01P 5/12*     (2006.01)
  *H02M 7/537*    (2006.01)

(56) References Cited

FOREIGN PATENT DOCUMENTS

| | | |
|---|---|---|
| CN | 102255550 A | 11/2011 |
| CN | 102891611 B | 10/2014 |
| CN | 204538975 U | 8/2015 |
| CN | 103580501 B | 4/2016 |
| CN | 105846696 A | 8/2016 |
| CN | 108111041 A | 6/2018 |
| CN | 110323955 A | 10/2019 |
| JP | H10234185 A | 9/1998 |

OTHER PUBLICATIONS

Rogerio Luiz da Silva Jr. et al.,"Reduced Switch Count Step-Up/Step-Down Switched-Capacitor Three-Phase AC-AC Converter",IEEE Transactions on Industrial Electronics, vol. 65, No. 11, Nov. 2018,total 11 pages.

Jiachuan You et al.,"A Novel Switched-Capacitor AC-AC Converter With A Ratio Of 1/4",2014 17th International ConferencH on Electrical Machine and Systems (iCEMS),Oct. 22-25, 2014, Hangzhou. China,total 3 pages.

Fabio Luis Tomm et al.,"HID Lamp Electronic Ballast Based on Chopper Converters",IEEE Transactions on Industrial Electronics. vol. 59, No. 4,,\PRU, 2012, Total 10 Pages.

Erickson: "Fundamentals of Power Electronics Second Edition", , Jan. 1, 2007 (Jan. 1, 2007), XP055462444, Total 881 Pages.

Meng Jian-hui et al.,"Research and application of novel high efficiency two-stage single-phase photovoltaic grid-connected inverter system",Power System Protection and Control,Vol.41 No. 20,Oct. 16, 2013,with an English abstract, total 6 pages.

Chih-Chiang Hua et al.,"Study of a charge/discharge equalizer",2014 International Conference on Information Science, Electronics and Electrical Engineering,total 4 pages.

* cited by examiner $|V_{c1}| > |V_{c2}|$
Positive half cycle

Negative half cycle $|V_{c1}| < |V_{c2}|$
Positive half cycle

Negative half cycle

OFF-GRID PHASE SPLITTER AND INVERTER SYSTEM

CROSS-REFERENCE TO RELATED APPLICATIONS

This application is a continuation of International Application No. PCT/CN2020/081152, filed on Mar. 25, 2020, which claims priority to Chinese Patent Application No. 201910516735.2, filed on Jun. 14, 2019. The disclosures of the aforementioned applications are hereby incorporated by reference in their entireties.

TECHNICAL FIELD

The present disclosure relates to the field of inverter technologies, and in particular, to an off-grid phase splitter and an inverter system.

BACKGROUND

An inverter is a power system that converts a direct current power supply into an alternating current power supply, and is widely used in new energy power generation industries such as the photovoltaic industry. As a core device for power generation, an inverter converts a direct current (DC) optimized by a photovoltaic module into an alternating current (AC), and then chooses to transmit the alternating current to a grid (on-grid) or supply the alternating current to a load (off-grid). As shown in FIG. 1, an inverter system in the conventional technology usually includes three power ports: a direct current input port, a battery port, and an alternating current output port, which correspond to three main operating modes: converting a solar direct current of a direct current input into an alternating current, and outputting the alternating current to a grid through the alternating current output port; when mains fails, converting a direct current on the battery port into an alternating current, and outputting the alternating current through the alternating current output port to supply power to a load; and converting a solar direct current of a direct current input, and charging a battery (e.g., energy storage).

Household power systems worldwide have two voltage levels: a 220 V grid system and a 110 V grid system. Currently, on-grid inverters in the industry are designed based on the 220 V system.

When an inverter operates on a grid, for the 220 V system, an alternating current port is connected to a live wire and a neutral wire of the 220 V system. For regions in which the 110 V system is used, for example, Japan and the United States, the alternating current output port of the inverter is connected to two live wires of the 110 V system, and a voltage difference between the two live wires is as follows: 110 V×1.732=190.5 V, which is close to 220 V. In this way, on-grid inverters are unified worldwide.

When mains is abnormal, the inverter may be disconnected from the grid and operate in an off-grid mode. If the inverter is connected to a battery, the inverter may output a 220 V alternating current voltage to directly supply power to a user load of the 220 V system. However, for the 110 V system, this voltage level cannot be used for a load of the 110 V system. In this case, voltage reduction or phase splitting needs to be performed on 220 V to reduce an output voltage to approximately 110 V, to supply power to a household single-phase load.

Currently, during off-grid phase splitting in a conventional inverter system, an industrial-frequency isolation transformer or an autotransformer is usually used to perform phase splitting. However, the industrial-frequency isolation transformer or the autotransformer has a large volume and large mass, and energy is consumed during on-grid application, resulting in low efficiency. In addition, during off-grid application, after the inverter system switches to the industrial-frequency isolation transformer or the autotransformer, the transformer undergoes a transition process. In this process, a large surge current occurs, and is likely to burn a fuse or cause relay sticking, posing hazards.

SUMMARY

Embodiments of this application provide an off-grid phase splitter and an inverter system. Power supply requirements of different load systems are met by using the off-grid phase splitter provided in this application. In addition, after a transformer of an inverter system is replaced with the off-grid phase splitter provided in this application, the following problems can be resolved: Due to existence of the transformer, the inverter system has an excessively large volume, and a security hazard that a surge current burns a fuse or causes relay sticking arises.

To achieve the foregoing objectives, the following technical solutions are used in the embodiments of this application.

According to a first aspect, an embodiment of this application provides an off-grid phase splitter, including: a first input port, a second input port, a first output port, a second output port, a third output port, a first capacitor, a second capacitor, a first switch circuit, a second switch circuit, and an inductor. The first input port and the second input port are separately connected to a power supply, and the power supply provides a first voltage by using the first phase port and the second phase port. For the first output port, the second output port, and the third output port, the first output port and the second output port provide a second voltage for a first load, and the second output port and the third output port provide a third voltage for a second load. Both the second voltage and the third voltage are less than the first voltage. For the first capacitor and the second capacitor, the first capacitor is connected between the first output port and the second output port, and the second capacitor is connected between the second output port and the third output port. For the first switch circuit and the second switch circuit, the first switch circuit and the second switch circuit are connected in series between the first input port and the second input port, and the first switch circuit and the second switch circuit are unidirectionally switched on in opposite directions. A first node is disposed between the first switch circuit and the second switch circuit. For the inductor, the inductor is connected between the first node and the second output port. The first switch circuit and the second switch circuit enable electricity on the first capacitor to be transferred to the second capacitor through the inductor, or enable electricity on the second capacitor to be transferred to the first capacitor through the inductor. In this embodiment of this application, after the two input ports of the off-grid phase splitter are connected to an external power circuit, a voltage at both ends of the first capacitor C1 and a voltage at both ends of the second capacitor C2 are controlled by controlling the first switch circuit and the second switch circuit to be switched on or off. In this way, a voltage between the first output port L1 and the second output port N and a voltage between the second output port N and the third output port L2 are regulated, so that the off-grid phase splitter meets power supply requirements of different load systems.

In another embodiment, the off-grid phase splitter further includes a driving control system. The driving control system controls, based on a voltage at both ends of the first capacitor and a voltage at both ends of the second capacitor, the first switch circuit and the second switch circuit to be unidirectionally switched on. In this application, the driving control system is used to control the first switch circuit and the second switch circuit to be unidirectionally switched on, to regulate the off-grid phase splitter.

In another embodiment, when an absolute value of a voltage value of a voltage at both ends of the first capacitor is greater than an absolute value of a voltage value of a voltage at both ends of the second capacitor, and a voltage value between the first output port and the third output port is a positive value, the second switch circuit forms a conducted circuit in a third direction; and when the first switch circuit forms a conducted circuit in a first direction, the first capacitor discharges to the inductor; or when the first switch circuit forms an open circuit in a first direction, the inductor charges the second capacitor in the third direction by using the second switch circuit. Alternatively, when an absolute value of a voltage value of a voltage at both ends of the first capacitor is greater than an absolute value of a voltage value of a voltage at both ends of the second capacitor, and a voltage value between the first output port and the third output port is a negative value, the second switch circuit forms a conducted circuit in a fourth direction; and when the first switch circuit forms a conducted circuit in a second direction, the first capacitor discharges to the inductor; or when the first switch circuit forms an open circuit in a second direction, the inductor charges the second capacitor in the fourth direction by using the second switch circuit. Alternatively, when an absolute value of a voltage value of a voltage at both ends of the first capacitor is less than an absolute value of a voltage value of a voltage at both ends of the second capacitor, and a voltage value between the first output port and the third output port is a positive value, the first switch circuit forms a conducted circuit in a first direction; and when the second switch circuit forms a conducted circuit in the third direction, the second capacitor discharges to the inductor; or when the second switch circuit forms an open circuit, the inductor charges the first capacitor in the first direction by using the first switch circuit. Alternatively, when an absolute value of a voltage value of a voltage at both ends of the first capacitor is less than an absolute value of a voltage value of a voltage at both ends of the second capacitor, and a voltage value between the first output port and the third output port is a negative value, the first switch circuit forms a conducted circuit in a second direction; and when the second switch circuit forms a conducted circuit in the fourth direction, the second capacitor discharges to the inductor; or when the second switch circuit forms an open circuit, the inductor charges the first capacitor in the second direction by using the first switch circuit. The first direction and the second direction are opposite directions. The third direction and the fourth direction are opposite directions. A direction in which a current on the first switch circuit flows to the inductor along the first direction is the same as a direction in which a current on the second switch circuit flows to the inductor along the third direction.

In another embodiment, the first switch circuit includes a first switch and a second switch, and the second switch circuit includes a third switch and a fourth switch. The first switch is configured to enable the first switch circuit to form a conducted circuit or an open circuit in the first direction, and the second switch is configured to enable the first switch circuit to form a conducted circuit or an open circuit in the second direction. The third switch is configured to enable the second switch circuit to form a conducted circuit or an open circuit in the third direction, and the fourth switch is configured to enable the second switch circuit to form a conducted circuit or an open circuit in the fourth direction.

In another embodiment, the first switch, the second switch, the third switch, and the fourth switch are formed by MOS transistors.

In another embodiment, the driving control system includes: a collector, configured to collect the voltage at both ends of the first capacitor, the voltage at both ends of the second capacitor, and a current of the inductor; a voltage regulator, configured to receive a difference between the voltage value of the voltage at both ends of the first capacitor and the voltage value of the voltage at both ends of the second capacitor, to obtain a first current; and a current regulator, configured to receive the generated current and the current of the inductor to obtain a fourth voltage. The driving control system calculates, based on the fourth voltage and a larger one of the voltage at both ends of the first capacitor and the voltage at both ends of the second capacitor, a duty cycle used to control the first switch, the second switch, the third switch, and the fourth switch.

According to a second aspect, an embodiment of this application provides an off-grid phase splitting method. A first input port and a second input port are separately connected to a power supply. The power supply provides a first voltage by using the first phase port and the second phase port. For a first output port, a second output port, and a third output port, the first output port and the second output port provide a second voltage for a first load, and the second output port and the third output port provide a third voltage for a second load. Both the second voltage and the third voltage are less than the first voltage. The method includes: controlling, based on a voltage difference between a voltage at both ends of a first capacitor and a voltage at both ends of a second capacitor, one of a first switch circuit and a second switch circuit to be switched on, so that one of the first capacitor and the second capacitor discharges to an inductor, where the first capacitor is connected between the first output port and the second output port, the second capacitor is connected between the second output port and the third output port, the first switch circuit and the second switch circuit are connected in series between the first input port and the second input port, a first node is disposed between the first switch circuit and the second switch circuit, and the inductor is connected between the first node and the second output port; and controlling the other one of the first switch circuit and the second switch circuit to be switched on, so that the inductor charges the other one of the first capacitor and the second capacitor.

According to a third aspect, an embodiment of this application provides an inverter system, including: an inverter, configured to convert a direct current signal into an alternating current signal; and an off-grid phase splitter. The off-grid phase splitter is the off-grid phase splitter in any one of the possible implementations of the first aspect. The power supply is provided by the inverter. A first phase port and a second phase port of the power supply are two output phase ports of the inverter. In this application, after different voltages are obtained through division by the off-grid phase splitter, requirements of different voltage systems for supplying power to loads can be met, and a structure is simple.

Compared with those of a transformer, a volume and a weight are reduced, so that the product is miniaturized and modularized, thereby reducing product costs and transportation costs. In addition, the off-grid phase splitter in this application does not perform an operation on a grid, thereby improving efficiency compared with the transformer that consumes energy on a grid when connected to the grid.

BRIEF DESCRIPTION OF DRAWINGS

The following briefly describes the accompanying drawings used in describing the embodiments or the conventional technology.

DESCRIPTION OF EMBODIMENTS

The following describes technical solutions in embodiments of this application with reference to accompanying drawings in the embodiments of this application.

Figure 1:
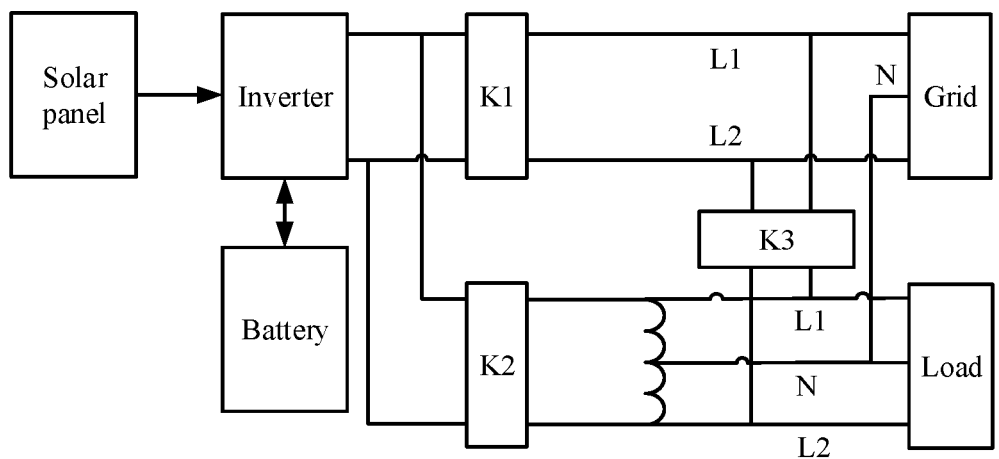
FIG. 1 is a schematic structural diagram of an inverter system in the conventional technology.
Figure 2:
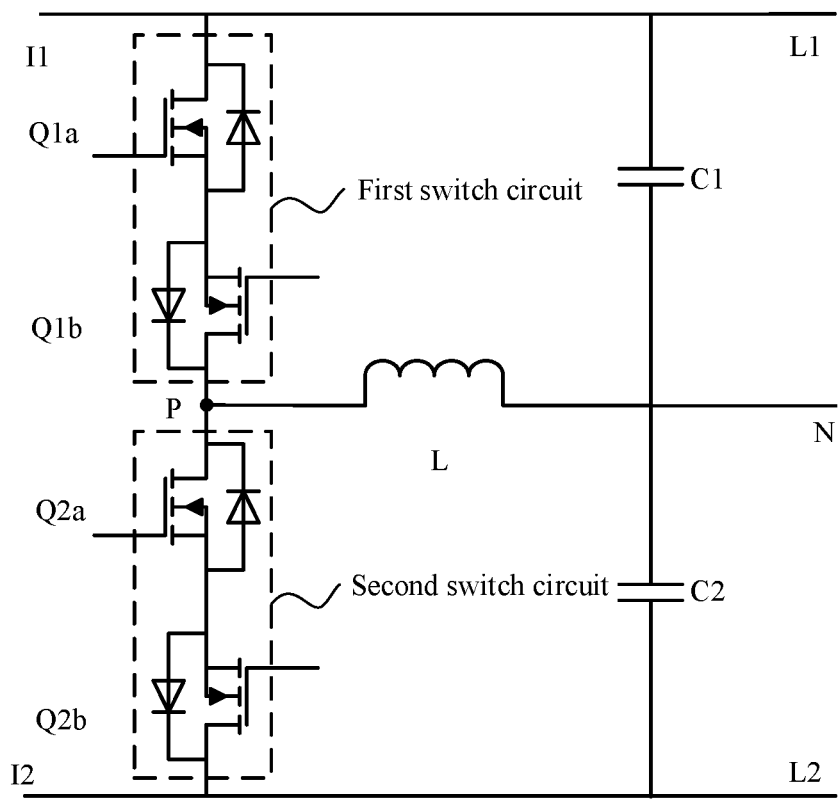
FIG. 2 is a schematic structural diagram of an off-grid phase splitter according to an embodiment of this application.

FIG. 2 is a schematic structural diagram of an off-grid phase splitter according to an embodiment of this application. As shown in FIG. 2, the off-grid phase splitter includes two input ports and three output ports. The two input ports include an input port K1 and an input port K2. The input port K1 and the input port K2 are respectively connected to a first phase port and a second phase port of a power supply. The power supply provides a first voltage by using the input port K1 and the input port K2. The three output ports include an output port L1, an output port N, and an output port L2. The output port L1 and the output port N provide a second voltage for a first load. The output port N and the output port L2 provide a third voltage for a second load. Both the second voltage and the third voltage are less than the first voltage.

In an embodiment, the input port K1 and the output port L1 share one port, and the input port K2 and the output port L2 share one port.

In an embodiment, the power supply connected to the two input ports is a single-phase alternating current power supply. Certainly, the power supply connected to the two input ports is not limited to an alternating current power supply, and may be alternatively a direct current power supply.

The off-grid phase splitter includes a first capacitor C1 and a second capacitor C2. The first capacitor C1 is connected between the output port L1 and the output port N, and the second capacitor C2 is connected between the output port N and the output port L2. In this case, a voltage $V_{C1}$ at both ends of the first capacitor C1 is a voltage between the output port L1 and the output port N, and a voltage $V_{C2}$ at both ends of the second capacitor C2 is a voltage between the output port N and the output port L2. The voltages $V_{C1}$ and $V_{C2}$ may be used to drive a load.

In an embodiment, the first capacitor C2 and the second capacitor C2 may be film capacitors, electrolytic capacitors, or the like. This is not limited in this embodiment of this application.

The off-grid phase splitter includes a first switch circuit and a second switch circuit. The first switch circuit and the second switch circuit are connected in series between the input port K1 and the input port K2. A node P is disposed between the first switch circuit and the second switch circuit. An inductor L is connected in series between the node P and the output port N.

In an embodiment of this application, the inductor L plays an intermediary role in energy transfer. In an embodiment, for example, the voltage $V_{C1}$ at both ends of the first capacitor C1 is greater than the voltage $V_{C2}$ at both ends of the second capacitor C2, and a part of the voltage at both ends of the first capacitor C1 is transferred to both ends of the second capacitor C2. The first switch circuit is switched on, so that the first capacitor C1, the first switch circuit, and the inductor L form a unidirectional ring circuit, and the first capacitor C1 discharges to the inductor L. Specifically, the ring circuit formed by the first capacitor C1, the first switch circuit, and the inductor L is in an on state. When the first switch circuit is switched on, the first capacitor C1 discharges, the circuit generates a current, and an induced electromotive force is generated on a coil of the inductor L. Then, after the first capacitor C1 completes discharging, the first switch circuit is switched off, and the second switch circuit is switched on, so that the second capacitor C2, the second switch circuit, and the inductor L form a unidirectional ring circuit, and the inductor L charges the second capacitor C2. Specifically, the ring circuit formed by the second capacitor C2, the second switch circuit, and the inductor L is in an on state. In this case, the inductor L charges the second capacitor C2 because an induced electromotive force is generated on the inductor L. Therefore, the voltage $V_{C1}$ at both ends of the first capacitor C1 is reduced, the voltage $V_{C2}$ at both ends of the second capacitor C2 is increased, and a part of the voltage at both ends of the first capacitor C1 is transferred to both ends of the second capacitor C2.

It should be noted that an amount of a transferred voltage is related to a quantity of electricity of charges released by the capacitor. Therefore, the quantity of electricity of the charges released by the capacitor is controlled by controlling an on time of the switch circuit, to control the transferred voltage.

In addition, the inductor L helps prevent an abrupt voltage change at both ends of the first capacitor C1 and both ends of the second capacitor C2, to prevent an excessively large loop current from occurring and damaging the switch circuit in a process of modulating the first switch circuit and the second switch circuit.

In an embodiment of this application, a function of the first switch circuit is to enable the ring circuit formed by the first switch circuit and the like to be switched on only unidirectionally at one moment.

In an embodiment, as shown in FIG. 2, in the ring circuit formed by the first capacitor C1, the first switch circuit, and the inductor L, when the first switch circuit is switched on and the first capacitor C1 discharges, the inductor L is charged. However, the first switch circuit can be switched on only unidirectionally at one moment, thereby avoiding a resonant circuit between the inductor L and the first capacitor C1.

In an embodiment, as shown in FIG. 2, in the ring circuit formed by the first capacitor C1, the first switch circuit, and the inductor L, when the first switch circuit is switched on and the first capacitor C1 is charged, the inductor L discharges. However, the first switch circuit can be switched on only unidirectionally at one moment, thereby preventing the first capacitor C1 from discharging when the first switch circuit is switched on, and avoiding a resonant circuit between the inductor L and the first capacitor C1.

A function of the second switch circuit is to enable the ring circuit formed by the second switch circuit to be switched on only unidirectionally at one moment. A specific implementation process is the same as the principle of the first switch circuit, and details are not described herein again.

In an embodiment, the first switch circuit includes a MOS (metal-oxide-semiconductor) transistor Q1$a$ and a MOS transistor Q1$b$. A drain of the MOS transistor Q1$a$ is connected to the input port K1. A source of the MOS transistor Q1$a$ is connected to a source of the MOS transistor Q1$b$. A drain of the MOS transistor Q1$b$ is connected to the node P. The second switch circuit includes a MOS transistor Q2$a$ and a MOS transistor Q2$b$. A drain of the MOS transistor Q2$a$ is connected to the node P. A source of the MOS transistor Q2$a$ is connected to a source of the MOS transistor Q2$b$. A drain of the MOS transistor Q2$b$ is connected to the output port L2.

In the first circuit, for the MOS transistor Q1$a$, when a gate provides a high level, a current may pass through the MOS transistor Q1$a$ bidirectionally; or when the gate provides a low level, a current can flow only through a body diode of the MOS transistor Q1$a$ in a direction from the source of the MOS transistor Q1$a$ to the drain of the MOS transistor Q1$a$. For the MOS transistor Q1$b$, when a gate provides a high level, a current may pass through the MOS transistor Q1$b$ bidirectionally; or when the gate provides a low level, a current can flow only through a body diode of the MOS transistor Q1$b$ in a direction from the source of the MOS transistor Q1$b$ to the drain of the MOS transistor Q1$b$.

During operating of the first switch circuit, on/off states of the MOS transistor Q1$a$ and the MOS transistor Q1$b$ are complementary. To be specific, the MOS transistor Q1$b$ is off when the MOS transistor Q1$a$ is on, or the MOS transistor Q1$b$ is on when the MOS transistor Q1$a$ is off. Therefore, for the first circuit, when the gate of the MOS transistor Q1$a$ is at a high level and the gate of the MOS transistor Q1$b$ is at a low level, a current can flow only from the drain of the MOS transistor Q1$a$ to the drain of the MOS transistor Q1$b$; or when the gate of the MOS transistor Q1$a$ is at a low level and the gate of the MOS transistor Q1$b$ is at a high level, a current can flow only from the drain of the MOS transistor Q1$b$ to the drain of the MOS transistor Q1$a$.

In the second circuit, for the MOS transistor Q2$a$, when a gate provides a high level, a current may pass through the MOS transistor Q2$a$ bidirectionally; or when the gate provides a low level, a current can flow only through a body diode of the MOS transistor Q2$a$ in a direction from the source of the MOS transistor Q2$a$ to the drain of the MOS transistor Q2$a$. For the MOS transistor Q2$b$, when a gate provides a high level, a current may pass through the MOS transistor Q2$b$ bidirectionally; or when the gate provides a low level, a current can flow only through a body diode of the MOS transistor Q2$b$ in a direction from the source of the MOS transistor Q2$b$ to the drain of the MOS transistor Q2$b$.

During operating of the second switch circuit, on/off states of the MOS transistor Q2$a$ and the MOS transistor Q2$b$ are also complementary. Therefore, for the second circuit, when the gate of the MOS transistor Q2$a$ is at a high level and the gate of the MOS transistor Q2$b$ is at a low level, a current can flow only from the drain of the MOS transistor Q2$a$ to the drain of the MOS transistor Q2$b$; or when the gate of the MOS transistor Q2$a$ is at a low level and the gate of the MOS transistor Q2$b$ is at a high level, a current can flow only from the drain of the MOS transistor Q2$b$ to the drain of the MOS transistor Q2$a$.

It should be noted that, in an embodiment of this application, the first switch circuit and the second switch circuit are implemented by using MOS transistors. However, this application is not limited to the MOS transistors, and another power switch device such as an IGBT may be alternatively used. This is not limited in this embodiment of this application.

It should be noted that, in this embodiment of this application, the first switch circuit and the second switch circuit are not limited to two switches, and may be alternatively three switches, four switches, or the like.

In an embodiment, after the two input ports of the off-grid phase splitter are connected to an external power circuit, the voltage at both ends of the first capacitor C1 and the voltage at both ends of the second capacitor C2 are controlled by controlling the first switch circuit and the second switch circuit to be switched on or off. In this way, the voltage between the output port L1 and the output port N and the voltage between the output port N and the output port L2 are regulated, so that the off-grid phase splitter meets power supply requirements of different load systems.

The following embodiment describes an operating principle of the off-grid phase splitter in an embodiment of this application by using an example in which the voltage at both ends of the first capacitor C1 and the voltage at both ends of the second capacitor C2 are modulated from different values into a same value. A person skilled in the art can easily figure out that the off-grid phase splitter provided in this application may also perform modulation in another manner. This is not limited herein.

It should be noted that, in an embodiment of this application, when a single-phase alternating current is connected to the off-grid phase splitter, according to a sinusoidal change rule of the alternating current, a voltage in a half cycle of the alternating current is a positive value, and a voltage of the other half cycle of the alternating current is a negative value. For ease of subsequent description, the following description is provided herein: In one cycle, a half cycle in which an alternating current is a positive value is defined as a positive half cycle, and a half cycle in which the alternating current is a negative value is defined as a negative half cycle.

FIG. 3($a$) to FIG. 3($d$) is a schematic diagram of an output voltage balancing process of the off-grid phase splitter when a phase load of the first capacitor C1 is less than a phase load of the second capacitor C2 according to an embodiment of this application. The phase load of the first capacitor C1 is a quantity of electricity on two electrode plates of the first capacitor C1. When the phase load of the first capacitor C1 is less than the phase load of the second capacitor C2, an effective voltage value at both ends of the first capacitor C1 is greater than an effective voltage value at both ends of the second capacitor C2: $|V_{c1}|>|V_{c2}|$.

FIG. 3 includes four parts: FIG. 3(a), FIG. 3(b), FIG. 3(c), and FIG. 3(d). FIG. 3(a) and FIG. 3(b) illustrate an output voltage balancing process of the off-grid phase splitter when an alternating current connected to the two input ports of the off-grid phase splitter is in a positive half cycle. FIG. 3(c) and FIG. 3(d) illustrate an output voltage balancing process of the off-grid phase splitter when an alternating current connected to the two input ports of the off-grid phase splitter is in a negative half cycle.

Figure 3A:
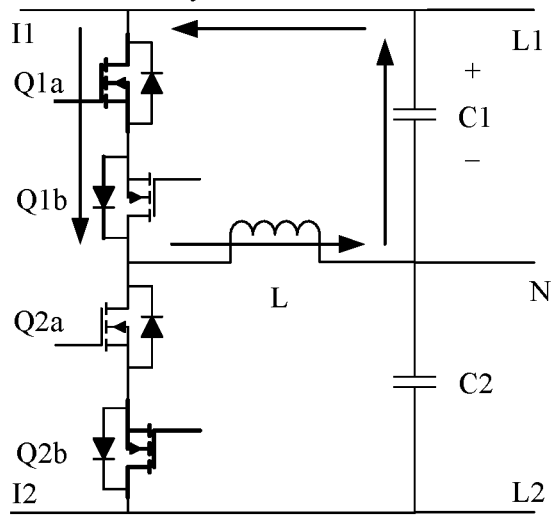
FIG. 3(a) to FIG. 3(d) is a schematic diagram of an output voltage balancing process of an off-grid phase splitter when a phase load of a first capacitor C1 is less than a phase load of a second capacitor C2 according to an embodiment of this application.

As shown in FIG. 3(a), the MOS transistor Q2a in the second switch circuit is set to an off state and the MOS transistor Q2b is set to an on state, so that a current can be conducted only clockwise in a loop formed by the second switch circuit. In addition, pulse width modulation (PWM) control is then performed on the MOS transistor Q1a and the MOS transistor Q1b in the first switch circuit.

In a process of performing pulse width modulation on the first switch circuit, first, the MOS transistor Q1a is set to an on state and the MOS transistor Q1b is set to an off state. In this case, the first switch circuit, the first capacitor C1, and the inductor L form a loop. Therefore, the first capacitor C1 discharges, and a current on the inductor L increases. In this case, a current loop is C1→Q1a→Q1b→L, to charge the inductor L.

Figure 3B:
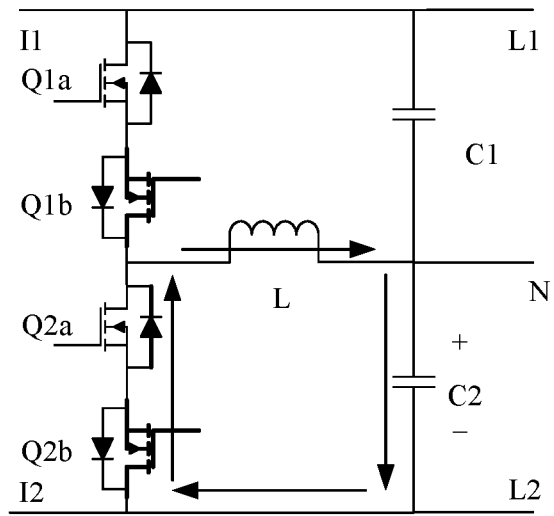

Then the MOS transistor Q1a is set to an off state and the MOS transistor Q1b is set to an on state. In this case, the current can be conducted only clockwise in the loop formed by the first switch circuit, the first capacitor C1, and the inductor L. In the second switch circuit, because the current can be conducted clockwise in the loop formed by the second switch circuit, the second capacitor C2, and the inductor L, the current on the inductor L resumes, and a current commutation loop is L→C2→Q2b→Q2a, to charge second capacitor C2, as shown in FIG. 3(b), so that the voltage $V_{c1}$ at both ends of the first capacitor C1 is the same as the voltage $V_{c2}$ at both ends of the second capacitor C2.

Figure 3C:
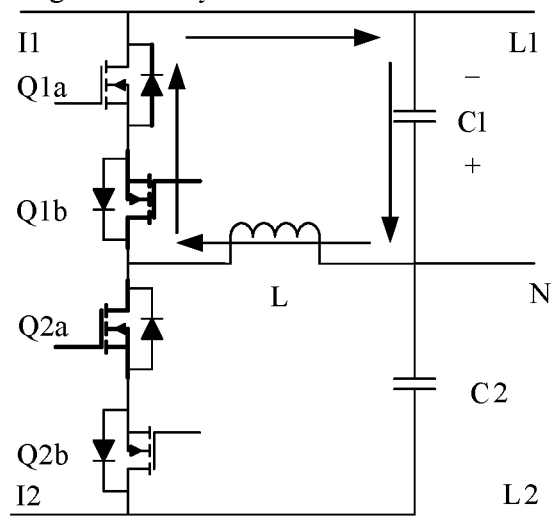

As shown in FIG. 3(c), the MOS transistor Q2a in the second switch circuit is in an on state and the MOS transistor Q2b is in an off state, so that a current can be conducted only counterclockwise in a loop formed by the second switch circuit. In addition, PWM control is then performed on the MOS transistor Q1a and the MOS transistor Q1b in the first switch circuit.

In a process of performing pulse width modulation on the first switch circuit, first, the MOS transistor Q1a is set to an off state and the MOS transistor Q1b is set to an on state. In this case, the first switch circuit, the first capacitor C1, and the inductor L form a loop. Therefore, the first capacitor C1 discharges, and a current on the inductor L increases. In this case, a current loop is C1→L→Q1b→Q1a, to charge the inductor L.

Figure 3D:
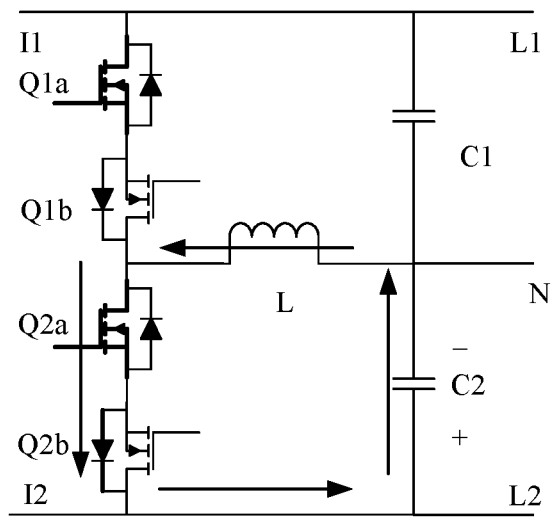

Then the MOS transistor Q1a is set to an on state and the MOS transistor Q1b is set to an off state. In this case, the current can be conducted only counterclockwise in the loop formed by the first switch circuit, the first capacitor C1, and the inductor L. In the second switch circuit, because the current can be conducted counterclockwise in the loop formed by the second switch circuit, the second capacitor C2, and the inductor L, the current on the inductor L resumes, and a current commutation loop is L→Q2a→Q2b→C2, to charge second capacitor C2, as shown in FIG. 3(d), so that the voltage $V_{c1}$ at both ends of the first capacitor C1 is the same as the voltage $V_{c2}$ at both ends of the second capacitor C2.

FIG. 4(a) to FIG. 4(d) is a schematic diagram of an output voltage balancing process of the off-grid phase splitter when a phase load of the first capacitor C1 is greater than a phase load of the second capacitor C2 according to an embodiment of this application. When the phase load of the first capacitor C1 is greater than the phase load of the second capacitor C2, an effective voltage value at both ends of the first capacitor C1 is less than an effective voltage value at both ends of the second capacitor C2: $|V_{c1}|<|V_{c2}|$.

FIG. 4 includes four parts: FIG. 4(a), FIG. 4(b), FIG. 4(c), and FIG. 4(d). FIG. 4(a) and FIG. 4(b) illustrate an output voltage balancing process of the off-grid phase splitter when an alternating current connected to the two input ports of the off-grid phase splitter is in a positive half cycle. FIG. 4(c) and FIG. 4(d) illustrate an output voltage balancing process of the off-grid phase splitter when an alternating current connected to the two input ports of the off-grid phase splitter is in a negative half cycle.

Figure 4A:
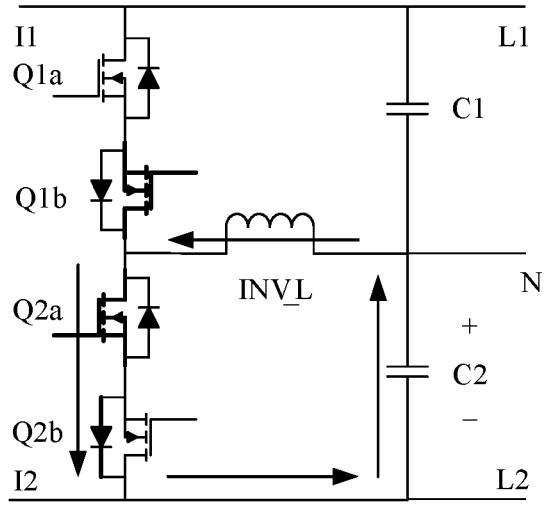
FIG. 4(a) to FIG. 4(d) is a schematic diagram of an output voltage balancing process of an off-grid phase splitter when a phase load of a first capacitor C1 is greater than a phase load of a second capacitor C2 according to an embodiment of this application.

As shown in FIG. 4(a), the MOS transistor Q1a in the first switch circuit is in an off state and the MOS transistor Q1b is in an on state, so that a current can be conducted only clockwise in a loop formed by the first switch circuit. In addition, PWM control is then performed on the MOS transistor Q2a and the MOS transistor Q2b in the second switch circuit.

In a process of performing pulse width modulation on the second switch circuit, first, the MOS transistor Q2a is set to an on state and the MOS transistor Q2b is set to an off state. In this case, the second switch circuit, the second capacitor C2, and the inductor L form a loop. Therefore, the second capacitor C2 discharges, and a current on the inductor L increases. In this case, a current loop is C2→L→Q2a→Q2b, to charge the inductor L.

Figure 4B:
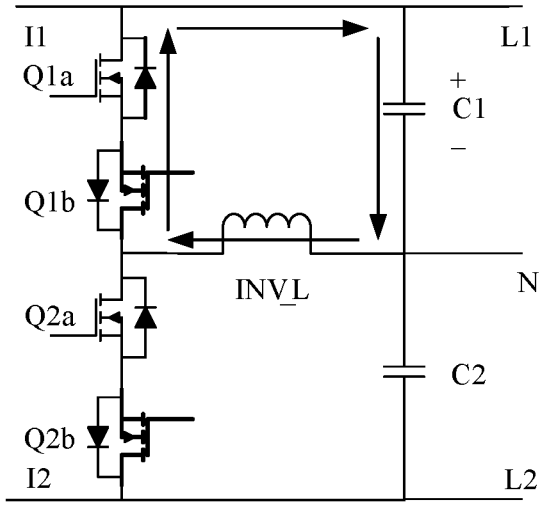

Then the MOS transistor Q2a is set to an off state and the MOS transistor Q2b is set to an on state. In this case, the current can be conducted only clockwise in the loop formed by the second switch circuit, the second capacitor C2, and the inductor L. In the first switch circuit, because the current can be conducted clockwise in the loop formed by the first switch circuit, the first capacitor C1, and the inductor L, the current on the inductor L resumes, and a current commutation loop is L→Q1b→Q1a→C1, to charge the first capacitor C1, as shown in FIG. 4(b), so that the voltage Vii at both ends of the first capacitor C1 is the same as the voltage $V_{c2}$ at both ends of the second capacitor C2.

Figure 4C:
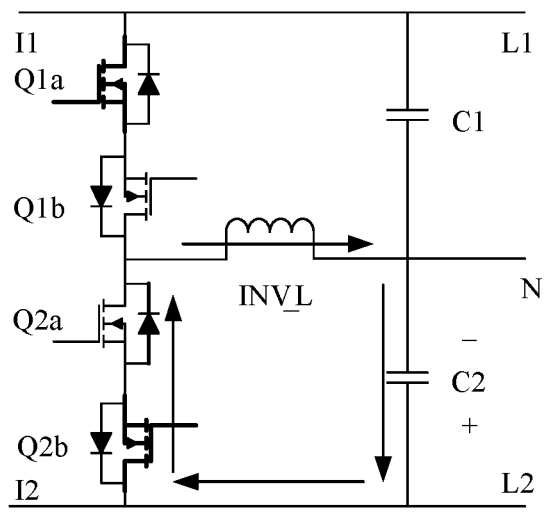

As shown in FIG. 4(c), the MOS transistor Q1a in the first switch circuit is in an on state and the MOS transistor Q1b is in an off state, so that a current can be conducted only counterclockwise in a loop formed by the first switch circuit. In addition, PWM control is then performed on the MOS transistor Q2a and the MOS transistor Q2b in the second switch circuit.

In a process of performing pulse width modulation on the second switch circuit, first, the MOS transistor Q2a is set to an off state and the MOS transistor Q2b is set to an on state. In this case, the second switch circuit, the second capacitor C2, and the inductor L form a loop. Therefore, the second capacitor C2 discharges, and a current on the inductor L increases. In this case, a current loop is C2→Q2b→Q2a→L, to charge the inductor L.

Figure 4D:
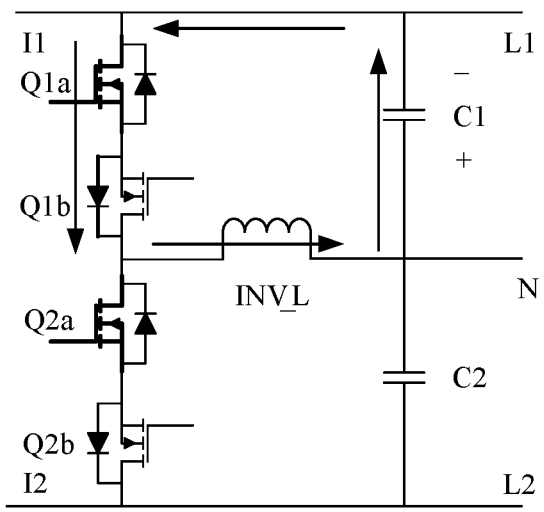

Then the MOS transistor Q2a is set to an on state and the MOS transistor Q2b is set to an off state. In this case, the current can be conducted only counterclockwise in the loop formed by the second switch circuit, the second capacitor C2, and the inductor L. In the first switch circuit, because the current can be conducted counterclockwise in the loop formed by the first switch circuit, the first capacitor C1, and the inductor L, the current on the inductor L resumes, and a current commutation loop is L→C1→Q1a→Q1b, to charge the first capacitor C1, as shown in FIG. 4(d), so that the voltage $V_{c1}$ at both ends of the first capacitor C1 is the same as the voltage $V_{c2}$ at both ends of the second capacitor C2.

In an embodiment, the gates of the MOS transistor Q1a, the MOS transistor Q1b, the MOS transistor Q2a, and the MOS transistor Q2b are connected to the driving control system. The driving control system performs PWM control on the MOS transistor Q1a, the MOS transistor Q1b, the MOS transistor Q2a, and the MOS transistor Q2b based on the voltage $V_{c1}$ at both ends of the first capacitor C1 and the voltage $V_{c2}$ at both ends of the second capacitor C2, so that the MOS transistor is in an on or off state. A specific control policy of the off-grid phase splitter is as follows:

The collector in the driving control system samples an instantaneous voltage value $V_{c1}$ at both ends of the first capacitor C1 of the off-grid phase splitter and an instantaneous voltage value $V_{c2}$ at both ends of the second capacitor C2 of the off-grid phase splitter in real time, and then determines magnitudes of absolute values of $V_{c1}$ and $V_{c2}$. A voltage Vo between the output port L1 and the output port L2 is equal to a sum of the instantaneous voltage value $V_{c1}$ at both ends of the first capacitor C1 and the instantaneous voltage value $V_{c2}$ at both ends of the second capacitor C2. In addition, the collector further collects an instantaneous current on the inductor L.

Figure 5:
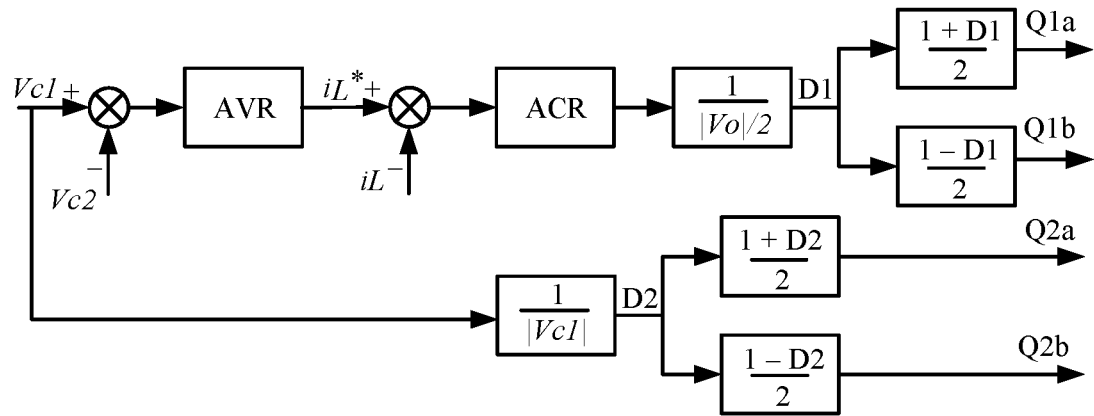
FIG. 5 is a schematic diagram of a process of controlling an off-grid phase splitter by a driving control system when a phase load of a first capacitor C1 is greater than a phase load of a second capacitor C2 according to an embodiment of this application.

FIG. 5 is a schematic diagram of a process of controlling the off-grid phase splitter by the driving control system when the phase load of the first capacitor C1 is greater than the phase load of the second capacitor C2 according to an embodiment of this application. As shown in FIG. 5, when $|V_{c1}|>|V_{c2}|$, a voltage regulator (e.g., Automatic Voltage Regulation or AVR) receives a difference between the instantaneous voltage value $V_{c1}$ at both ends of the first capacitor C1 and the instantaneous voltage value $V_{c2}$ at both ends of the second capacitor C2, to obtain an induced current iL*. A current regulator (e.g., Automatic Current Regulation or ACR) receives a difference between the induced current iL* generated by the AVR and the instantaneous current on the inductor L that is collected by the collector, to obtain an induced voltage V*.

Then the driving control system divides the induced voltage V* by half of an absolute value of the total output voltage $V_o$ to obtain a control variable D1, and then decomposes the control variable D1 into (1+D1)/2 and (1−D1)/2 as duty cycles of the MOS transistors Q1a and Q1b, respectively. In addition, the driving control system directly divides a value of $V_{c1}$ by an absolute value of $V_{c1}$ to obtain a control variable D2, and decomposes the control variable D2 into (1+D2)/2 and (1−D2)/2 as duty cycles of the MOS transistors Q2b and Q2a, respectively. In this control process, the duty cycles are adjusted, so that C1 discharges and C2 is charged, and finally, the voltage $V^{c1}$ at both ends of the first capacitor C1 is the same as the voltage $V_{c2}$ at both ends of the second capacitor C2.

Figure 6:
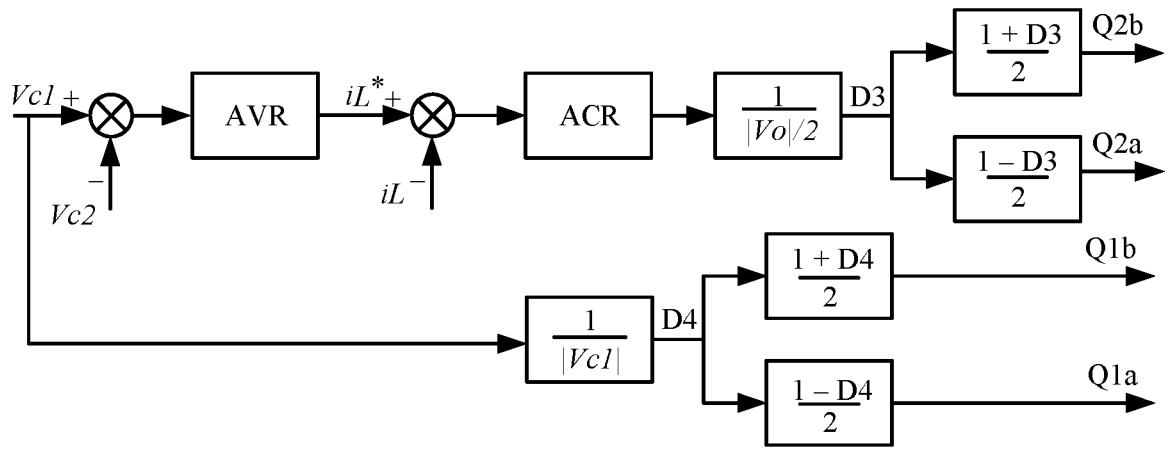
FIG. 6 is a schematic diagram of a process of controlling an off-grid phase splitter by a driving control system when a phase load of a first capacitor C1 is less than a phase load of a second capacitor C2 according to an embodiment of this application.

FIG. 6 is a schematic diagram of a process of controlling the off-grid phase splitter by the driving control system when the phase load of the first capacitor C1 is less than the phase load of the second capacitor C2 according to an embodiment of this application. As shown in FIG. 6, when $|V_{c1}|<|V_{c2}|$, an AVR receives a difference between the instantaneous voltage value $V_{c1}$ at both ends of the first capacitor C1 and the instantaneous voltage value $V_{c2}$ at both ends of the second capacitor C2, to obtain an induced current iL*. An ACR receives a difference between the induced current iL* generated by the AVR and the instantaneous current on the inductor L that is collected by the collector, to obtain an induced voltage V*.

Then the driving control system divides the induced voltage V* by half of an absolute value of the total output voltage Vo to obtain a control variable D3, and then decomposes the control variable D3 into (1+D3)/2 and (1−D3)/2 as duty cycles of the MOS transistors Q2a and Q2b, respectively. In addition, the driving control system directly divides a value of $V_{c1}$ by an absolute value of $V_{c1}$ to obtain a control variable D4, and decomposes the control variable D4 into (1+D4)/2 and (1−D4)/2 as duty cycles of the MOS transistors Q1b and Q1a, respectively. In this control process, the duty cycles are adjusted, so that C2 discharges and C1 is charged, and finally, the voltage $V^{c1}$ at both ends of the first capacitor C1 is the same as the voltage $V_{c2}$ at both ends of the second capacitor C2.

According to the off-grid phase splitter provided in an embodiment of this application, voltage division is performed on an input voltage, so that an output port outputs different voltages, to meet requirements of the off-grid phase splitter for supplying power to different load systems.

Figure 7:
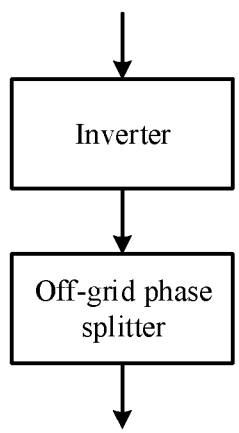
FIG. 7 is a schematic diagram of an inverter system according to an embodiment of this application.

FIG. 7 is a schematic diagram of an inverter system according to an embodiment of this application. As shown in FIG. 7, the inverter system provided in this embodiment of this application includes an inverter and an off-grid phase splitter.

The inverter is configured to convert a direct current signal into an alternating current signal. In an embodiment, when the inverter is connected to a direct current power supply, the inverter converts a direct current voltage input from the direct current power supply into an alternating current voltage, and then inputs the alternating current voltage to a grid or a load.

The inverter may further convert an alternating current signal into a direct current signal. In another embodiment, when the inverter is connected to a power storage device, the inverter converts an alternating current voltage input from a grid into a direct current voltage, and then inputs the direct current voltage to the power storage device for storage.

The off-grid phase splitter is connected to the inverter, and is configured to receive an alternating current signal, perform voltage division on the alternating current signal, and then input an alternating current signal obtained through voltage division to a load and/or a grid connected to the off-grid phase splitter.

The off-grid phase splitter used in the inverter system is the off-grid phase splitter provided in the foregoing embodiments of this application, and a structure and an operating principle of the off-grid phase splitter are not described herein again.

Figure 8:
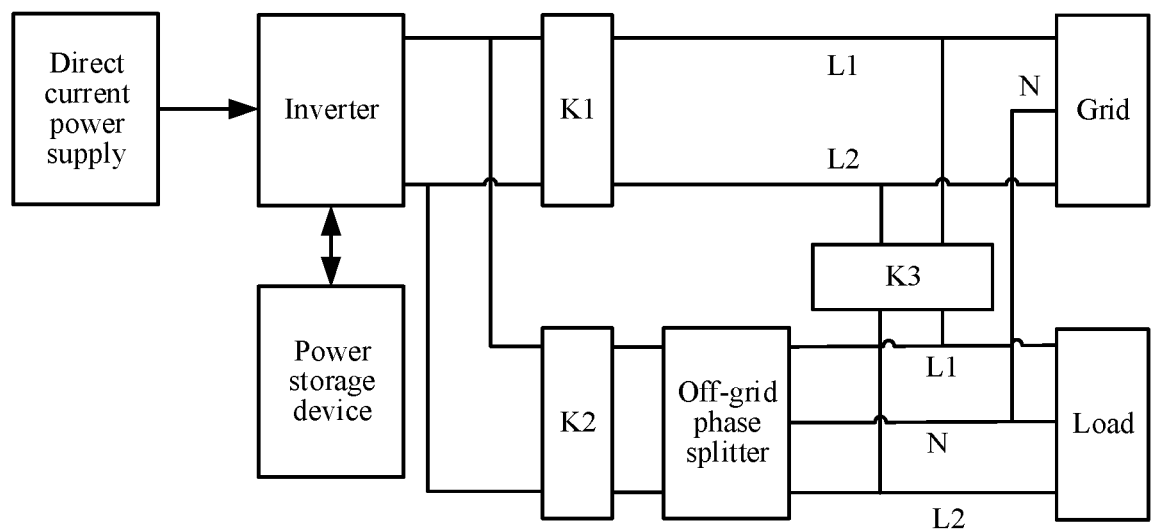
FIG. 8 is a schematic structural diagram of an inverter system in which an off-grid phase splitter is used according to an embodiment of this application.

FIG. 8 is a schematic structural diagram of an inverter system in which an off-grid phase splitter is used according to an embodiment of this application. As shown in FIG. 8, an alternating current voltage output by an inverter provided in this embodiment of this application is 220 V, and a voltage between an output port L1 and an output port N and a voltage between the output port N and an output port L2 that are obtained through voltage division by the off-grid phase splitter are both 110 V.

The inverter system provided in this embodiment of this application includes the inverter, the off-grid phase splitter, a first switch K1, a second switch K2, and a third switch K3.

The inverter is separately connected to a direct current power supply, a power storage device, a grid, a load, and the off-grid phase splitter. An input port of the off-grid phase splitter is connected to the inverter and the grid, and an output port of the off-grid phase splitter is connected to the grid and the load. The first switch K1 is disposed between the inverter and the grid and load, and is configured to control a connection between the inverter and the grid and load. The second switch K2 is disposed between the inverter and the off-grid phase splitter, and is configured to control a connection between the inverter and the off-grid phase splitter. The third switch K3 is disposed between the inverter and the load, and is configured to control a connection between the inverter and the load.

When the inverter operates on the grid, the switches K1 and K3 are controlled to be switched on, K2 is controlled to be switched off, and the input port of the off-grid phase splitter is disconnected from an output port of the inverter. The inverter draws energy from the direct current power supply, connects to the grid to generate electricity, and charges the power storage device. The grid supplies power to the load. Ports L1, N, and L2 of the grid are separately connected to the output port of the off-grid phase splitter. In this case, all switches controlling the off-grid phase splitter are in an off state, and the off-grid phase splitter does not operate, without power loss.

When the inverter operates off the grid, the switches K1 and K3 are controlled to be switched off, K2 is controlled to be switched on, an input of the off-grid phase splitter is connected to the output port of the inverter, and the output port of the off-grid phase splitter is connected to the load. The load may be a load of a 220 V system (the load is connected between L1 and L2), or may be a single-phase load of a 110 V system (the load is connected between L1 and N or between L2 and N). When an output of the off-grid phase splitter is connected to a load of a 220 V system, the off-grid phase splitter is also in an idle state, without power loss. When an output of the off-grid phase splitter is connected to a load of a 110 V system, a load (C1-phase) between L1 and N and a load (C2-phase) between L2 and N are unbalanced. As a result, an output voltage of a C1 phase and an output voltage of a C2 phase are unbalanced. In this case, a voltage difference between a phase voltage $V_{c1}$ of a voltage divider capacitor C1 and a phase voltage $V_{c2}$ of a voltage divider capacitor C2 needs to be controlled, to dynamically regulate $V_{c1}$ and $V_{c2}$ by using the switches, thereby ensuring that the output voltages of the two phases are balanced.

This embodiment of this application provides an inverter system in which an off-grid phase splitter is used. After different voltages are obtained through division by the off-grid phase splitter, requirements of different voltage systems for supplying power to loads can be met, and a structure is simple. Compared with those of a transformer, a volume and a weight are reduced, so that the product is miniaturized and modularized, thereby reducing product costs and transportation costs. In addition, the off-grid phase splitter in this application does not perform an operation on a grid, thereby improving efficiency compared with the transformer that consumes energy on a grid when connected to the grid.

In the descriptions of this specification, the described specific features, structures, materials, or characteristics may be combined in a proper manner in any one or more of the embodiments or examples.

And finally, it should be noted that the foregoing embodiments are merely intended for describing technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:

1. An off-grid phase splitter, comprising:
   a first input port and a second input port separately connected to a power supply that provides a first voltage;
   a first output port, a second output port, and a third output port, wherein the first output port and the second output port provide a second voltage, the second output port and the third output port provide a third voltage, and both the second voltage and the third voltage are less than the first voltage;
   a first capacitor connected between the first output port and the second output port, and a second capacitor connected between the second output port and the third output port;
   a first switch circuit and a second switch circuit connected in series to form a first node between the first input port and the second input port, wherein the first switch circuit and the second switch circuit are unidirectionally switched on in opposite directions;
   an inductor is connected between the first node and the second output port, wherein the first switch circuit and the second switch circuit enable electricity on the first capacitor to be transferred to the second capacitor through the inductor, or vice versa; and
   a driving control system to control, based on a voltage at both ends of the first capacitor and a voltage at both ends of the second capacitor, the first switch circuit and the second switch circuit to be unidirectionally switched on, wherein the driving control system comprises:
   a collector, configured to collect the voltage at both ends of the first capacitor, the voltage at both ends of the second capacitor, and a current of the inductor;
   a voltage regulator, configured to receive a difference between a voltage value of the voltage at both ends of the first capacitor and a voltage value of the voltage at both ends of the second capacitor, to obtain a first current; and
   a current regulator, configured to receive a generated current and the current of the inductor to obtain a fourth voltage, wherein
   the driving control system calculates, based on the fourth voltage and a larger one of the voltage at both ends of the first capacitor and the voltage at both ends of the second capacitor, a duty cycle used to control the first switch circuit and the second switch circuit.

2. The off-grid phase splitter according to claim 1, wherein
   when an absolute voltage value of a voltage at both ends of the first capacitor is greater than an absolute voltage value of a voltage at both ends of the second capacitor, and a voltage value between the first output port and the third output port is a positive value, the second switch circuit forms a conducted circuit in a third direction; and when the first switch circuit forms a conducted circuit in a first direction, the first capacitor discharges to the inductor; or when the first switch circuit forms an open circuit in the first direction, the inductor charges the second capacitor in the third direction by using the second switch circuit.

3. The off-grid phase splitter according to claim 2, wherein when an absolute voltage value of a voltage at both ends of the first capacitor is greater than an absolute voltage value of a voltage at both ends of the second capacitor, and a voltage value between the first output port and the third output port is a negative value, the second switch circuit forms a conducted circuit in a fourth direction; and when the first switch circuit forms a conducted circuit in a second direction, the first capacitor discharges to the inductor; or when the first switch circuit forms an open circuit in the second direction, the inductor charges the second capacitor in the fourth direction by using the second switch circuit.

4. The off-grid phase splitter according to claim 1, wherein when an absolute value voltage value of a voltage at both ends of the first capacitor is less than an absolute voltage value of a voltage at both ends of the second capacitor, and a voltage value between the first output port and the third output port is a positive value, the first switch circuit forms a conducted circuit in a first direction; and when the second switch circuit forms a conducted circuit in a third direction, the second capacitor discharges to the inductor; or when the second switch circuit forms an open circuit, the inductor charges the first capacitor in the first direction by using the first switch circuit.

5. The off-grid phase splitter according to claim 4, wherein when an absolute voltage value of a voltage at both ends of the first capacitor is less than an absolute voltage value of a voltage at both ends of the second capacitor, and a voltage value between the first output port and the third output port is a negative value, the first switch circuit forms a conducted circuit in a second direction; and when the second switch circuit forms a conducted circuit in a fourth direction, the second capacitor discharges to the inductor; or when the second switch circuit forms an open circuit, the inductor charges the first capacitor in the second direction by using the first switch circuit.

6. The off-grid phase splitter according to claim 5, wherein the first direction and the second direction are opposite directions, the third direction and the fourth direction are opposite directions, a direction in which a current on the first switch circuit flows to the inductor along the first direction is the same as a direction in which a current on the second switch circuit flows to the inductor along the third direction.

7. The off-grid phase splitter according to claim 5, wherein the first switch circuit comprises a first switch and a second switch, and the second switch circuit comprises a third switch and a fourth switch;

a first switch configured to enable the first switch circuit to form a conducted circuit or an open circuit in the first direction; and a second switch configured to enable the first switch circuit to form a conducted circuit or an open circuit in the second direction.

8. The off-grid phase splitter according to claim 7, wherein the first switch and the second switch are formed by MOS transistors.

9. The off-grid phase splitter according to claim 5, wherein the second switch circuit comprises:

a third switch configured to enable the second switch circuit to form a conducted circuit or an open circuit in the third direction; and a fourth switch configured to enable the second switch circuit to form a conducted circuit or an open circuit in the fourth direction.

10. The off-grid phase splitter according to claim 9, wherein the third switch and the fourth switch are formed by MOS transistors.

11. The off-grid phase splitter according to claim 1, wherein the driving control system calculates, based on the fourth voltage and the larger one of the voltage at both ends of the first capacitor and the voltage at both ends of the second capacitor, a duty cycle used to control a first switch, a second switch, a third switch, and a fourth switch.

12. An off-grid phase splitting method, comprising:
providing a first input port and a second input port separately connected to a power supply that provides a first voltage;

providing a first output port, a second output port, and a third output port, wherein the first output port and the second output port provide a second voltage, wherein the second output port and the third output port provide a third voltage, and wherein both the second voltage and the third voltage are less than the first voltage;

controlling, based on a voltage difference between a voltage at both ends of a first capacitor and a voltage at both ends of a second capacitor, one of a first switch circuit and a second switch circuit to be switched on, so that one of the first capacitor and the second capacitor discharges to an inductor, wherein the first capacitor is connected between the first output port and the second output port, the second capacitor is connected between the second output port and the third output port, the first switch circuit and the second switch circuit are connected in series to form a first node between the first input port and the second input port, and the inductor is connected between the first node and the second output port;

controlling the other one of the first switch circuit and the second switch circuit to be switched on, so that the inductor charges the other one of the first capacitor and the second capacitor; and controlling by a driving control system, based on the voltage at both ends of the first capacitor and the voltage at both ends of the second capacitor, the first switch circuit and the second switch circuit to be unidirectionally switched on, wherein the driving control system further performs operations:

collecting, by a collector of the driving control system, the voltage at both ends of the first capacitor, the voltage at both ends of the second capacitor, and a current of the inductor;

receiving, by a voltage regulator of the driving control system, a difference between a voltage value of the voltage at both ends of the first capacitor and a voltage value of the voltage at both ends of the second capacitor, to obtain a first current;

receiving, by a current regulator of the driving control system, a generated current and the current of the inductor to obtain a fourth voltage; and calculating, based on the fourth voltage and a larger one of the voltage at both ends of the first capacitor and the voltage at both ends of the second capacitor, a duty cycle used to control the first switch circuit and the second switch circuit.

13. An inverter system, comprising:

an inverter, configured to convert a direct current signal into an alternating current signal; and an off-grid phase splitter, including:
- a first input port and a second input port separately connected to a power supply that provides a first voltage,
- a first output port, a second output port, and a third output port, wherein the first output port and the second output port provide a second voltage, the second output port and the third output port provide a third voltage, and both the second voltage and the third voltage are less than the first voltage,
- a first capacitor connected between the first output port and the second output port, and a second capacitor connected between the second output port and the third output port,
- a first switch circuit and a second switch circuit connected in series to form a first node between the first input port and the second input port, wherein the first switch circuit and the second switch circuit are unidirectionally switched on in opposite directions,
- an inductor is connected between the first node and the second output port, wherein the first switch circuit and the second switch circuit enable electricity on the first capacitor to be transferred to the second capacitor through the inductor, or vice versa, and a driving control system to control, based on a voltage at both ends of the first capacitor and a voltage at both ends of the second capacitor, the first switch circuit and the second switch circuit to be unidirectionally switched on, wherein the driving control system comprises:

a collector, configured to collect the voltage at both ends of the first capacitor, the voltage at both ends of the second capacitor, and a current of the inductor;

a voltage regulator, configured to receive a difference between a voltage value of the voltage at both ends of the first capacitor and a voltage value of the voltage at both ends of the second capacitor, to obtain a first current; and a current regulator, configured to receive a generated current and the current of the inductor to obtain a fourth voltage, wherein
the driving control system calculates, based on the fourth voltage and a larger one of the voltage at both ends of the first capacitor and the voltage at both ends of the second capacitor, a duty cycle used to control the first switch circuit and the second switch circuit.

14. The inverter system according to claim 13, wherein
when an absolute voltage value of a voltage at both ends of the first capacitor is greater than an absolute voltage value of a voltage at both ends of the second capacitor, and a voltage value between the first output port and the third output port is a positive value, the second switch circuit forms a conducted circuit in a third direction; and when the first switch circuit forms a conducted circuit in a first direction, the first capacitor discharges to the inductor; or when the first switch circuit forms an open circuit in the first direction, the inductor charges the second capacitor in the third direction by using the second switch circuit.

15. The inverter system according to claim 14, wherein
when an absolute voltage value of a voltage at both ends of the first capacitor is greater than an absolute voltage value of a voltage at both ends of the second capacitor, and a voltage value between the first output port and the third output port is a negative value, the second switch circuit forms a conducted circuit in a fourth direction; and when the first switch circuit forms a conducted circuit in a second direction, the first capacitor discharges to the inductor; or when the first switch circuit forms an open circuit in the second direction, the inductor charges the second capacitor in the fourth direction by using the second switch circuit.

16. The inverter system according to claim 13, wherein
when an absolute value voltage value of a voltage at both ends of the first capacitor is less than an absolute voltage value of a voltage at both ends of the second capacitor, and a voltage value between the first output port and the third output port is a positive value, the first switch circuit forms a conducted circuit in a first direction; and when the second switch circuit forms a conducted circuit in a third direction, the second capacitor discharges to the inductor; or when the second switch circuit forms an open circuit, the inductor charges the first capacitor in the first direction by using the first switch circuit.

17. The inverter system according to claim 16, wherein
when an absolute voltage value of a voltage at both ends of the first capacitor is less than an absolute voltage value of a voltage at both ends of the second capacitor, and a voltage value between the first output port and the third output port is a negative value, the first switch circuit forms a conducted circuit in a second direction; and when the second switch circuit forms a conducted circuit in a fourth direction, the second capacitor discharges to the inductor; or when the second switch circuit forms an open circuit, the inductor charges the first capacitor in the second direction by using the first switch circuit.

18. The inverter system according to claim 17, wherein,
the first direction and the second direction are opposite directions, the third direction and the fourth direction are opposite directions, a direction in which a current on the first switch circuit flows to the inductor along the first direction is the same as a direction in which a current on the second switch circuit flows to the inductor along the third direction.

* * * * *